US008896619B2

(12) United States Patent
Rezaee

(10) Patent No.: US 8,896,619 B2
(45) Date of Patent: Nov. 25, 2014

(54) APPARATUS, METHOD AND COMPUTER-READABLE STORAGE MEDIUM FOR COMPENSATING FOR IMAGE-QUALITY DISCREPANCIES

(75) Inventor: Mahmoud Ramze Rezaee, Vancouver (CA)

(73) Assignee: McKesson Financial Holdings, Hamilton (BM)

( * ) Notice: Subject to any disclaimer, the term of this patent is extended or adjusted under 35 U.S.C. 154(b) by 900 days.

(21) Appl. No.: 13/044,122

(22) Filed: Mar. 9, 2011

(65) Prior Publication Data

US 2012/0229490 A1 Sep. 13, 2012

(51) Int. Cl.

| | |
|---|---|
| ***G09G 5/00*** | (2006.01) |
| ***G09G 5/02*** | (2006.01) |
| ***H04N 17/02*** | (2006.01) |
| ***H04N 5/202*** | (2006.01) |
| ***H04N 1/46*** | (2006.01) |
| ***G03F 3/08*** | (2006.01) |
| ***G06K 9/00*** | (2006.01) |
| ***G06K 9/40*** | (2006.01) |
| ***G06K 9/36*** | (2006.01) |
| ***G01D 18/00*** | (2006.01) |
| ***G09G 5/10*** | (2006.01) |

(52) U.S. Cl.

CPC .......... *G09G 5/10* (2013.01); *G09G 2320/0693* (2013.01); *G09G 2380/08* (2013.01); *G09G 2320/0276* (2013.01)

USPC ............ 345/589; 345/1.1; 345/600; 345/606; 345/643; 345/690; 348/180; 348/254; 358/504; 358/519; 358/525; 382/132; 382/274; 382/276; 702/85

(58) Field of Classification Search

USPC ......... 345/581, 589, 600–601, 606, 643, 501, 345/204, 690, 694, 698, 214, 1.1–1.3; 348/177, 180, 184, 222.1, 223.1, 254, 348/739; 358/504, 518, 519, 520, 525, 523; 382/128, 130, 131, 132, 140, 254, 274, 382/276; 600/166, 178, 180, 183; 702/85, 702/86, 90

See application file for complete search history.

(56) References Cited

U.S. PATENT DOCUMENTS 5,818,624 A 10/1998 Patterson et al.
7,136,518 B2 11/2006 Griffin et al.

(Continued)

OTHER PUBLICATIONS

Office Action for U.S. Appl. No. 13/182,055; dated Aug. 16, 2013.

(Continued)

*Primary Examiner* — Wesner Sajous
(74) *Attorney, Agent, or Firm* — Alston & Bird LLP

(57) ABSTRACT

An apparatus is provided that includes a processor and memory storing executable instructions that in response to execution by the processor cause the apparatus to at least perform a number of operations. The apparatus is caused to receive a digital image including pixels each of which has a pixel value that has been calibrated according to a first calibration function for calibrating an image for display by a first monitor. The apparatus is caused to transform the pixel value of each of at least some of the pixels to a corresponding transformed pixel value calibrated according to a second calibration function for calibrating an image for display by a second monitor. The apparatus is also caused to cause output of the digital image including the plurality of pixels each of at least some of which has a transformed pixel value, the respective digital image being displayable by the second monitor.

21 Claims, 5 Drawing Sheets

(56) References Cited

U.S. PATENT DOCUMENTS

| | | | | |
|---|---|---|---|---|
| 7,459,696 | B2 | 12/2008 | Schomacker et al. | |
| 7,469,160 | B2 | 12/2008 | Banks et al. | |
| 2003/0169915 | A1 | 9/2003 | Takeo | |
| 2004/0196250 | A1 * | 10/2004 | Mehrotra et al. | 345/102 |
| 2005/0174309 | A1 * | 8/2005 | Bouwens et al. | 345/83 |
| 2007/0055143 | A1 * | 3/2007 | Deroo et al. | 600/425 |
| 2009/0324073 | A1 | 12/2009 | Wengler et al. | |
| 2010/0166281 | A1 | 7/2010 | Burger et al. | |
| 2011/0182501 | A1 * | 7/2011 | Mercier et al. | 382/159 |
| 2011/0257519 | A1 * | 10/2011 | Bjørnerud et al. | 600/431 |
| 2013/0187958 | A1 * | 7/2013 | Kimpe et al. | 345/690 |
| 2013/0287313 | A1 * | 10/2013 | Marchessoux et al. | 382/274 |

OTHER PUBLICATIONS

Adams, R., et al.; "Seeded region growing"; IEEE Transactions on Pattern Analysis and Machine Intelligence; vol. 16; Issue 6; Jun. 1994; pp. 641-647.

Arifin, A.Z., et al.; "Image segmentation by histogram thresholding using hierarchical cluster analysis"; Pattern Recognition Letters; 2006; pp. 1-7.

Besl, P.J., et al.; "Segmentation Through Variable-Order Surface Fitting"; IEEE Transactions on Pattern Analysis and Machine Intelligence; vol. 10; Issue 2; Mar. 1998; pp. 167-192.

Cootes, T.F., et al.; "Active Appearance Models"; IEEE Transactions on Pattern Analysis and Machine Intelligence; vol. 23; No. 6; Jun. 2001; pp. 681-685.

Cootes, T.F., et al.; "Active Shape Models—Their Training and Application"; Computer Vision and Image Understanding; vol. 61; Issue 1; Jan. 1995; pp. 38-59.

Dijkstra, E.W.; "A Note on Two Problems in Connexion with Graphs"; Numerische Mathematik; vol. 1; 1959; pp. 269-271.

Pham, D.L., et al.; "Current Methods in Medical Image Segmentation"; Annual Review of Biomedical Engineering; vol. 2; Aug. 2000; pp. 315-337.

Rezaee, M.R., et al.; "A Multiresolution Image Segmentation Technique Based on Pyramidal Segmentation and Fuzzy Clustering"; IEEE Transactions on Image Processing; vol. 9; Issue 7; Jul. 2000; pp. 1238-1248.

Notice of Allowance for U.S. Appl. No. 13/233,656 dated Jan. 7, 2013.

*PS 3.14—2009, Digital Imaging and Communications in Medicine (DICOM), Part 14: Grayscale Standard Display Function*; National Electrical Manufacturers Association, 2009; 55 pages.

Tanaka, et al.; *Application of Grayscale Standard Display Funtion to General Purpose Liquid-Crystal Display Monitors for Clinical Use*; pp. 25-32, Jan. 20, 2010.

*About Gamma Correction* http://www.graphics.stanford.edu/gamma.html (3 pgs.) site visited Feb. 8, 2011 9:00 AM.

*CGSD—Gamma Correction Explained* http://www.siggraph.org/education/materials/HyperGraph/gamma_corr . . . (3 pgs.) Site visited Feb. 8, 2011 9:00 AM.

* cited by examiner

APPARATUS, METHOD AND COMPUTER-READABLE STORAGE MEDIUM FOR COMPENSATING FOR IMAGE-QUALITY DISCREPANCIES

FIELD OF THE INVENTION

The present invention generally relates to medical imaging, and more particularly, to compensating for image-quality discrepancies between an imaging modality and a viewing station.

BACKGROUND OF THE INVENTION

Medical imaging often includes creating images of the human body or parts of the human body for clinical purposes such as examination, diagnosis and/or treatment. These images may be acquired by a number of different imaging modalities including, for example, ultrasound (US), magnetic resonance (MR), positron emission tomography (PET), computed tomography (CT), mammograms (MG) digital radiology (DR), computed radiology (CR) or the like. In a number of example medical imaging workflows, an acquired image may be reviewed by a technician of the imaging modality, and then sent to a viewing station where the image may be reviewed by a medical professional such as a radiologist. This is the case, for example, in a picture archiving and communication system (PACS).

Maintaining consistency in the quality of an acquired image through an imaging workflow is often desirable. Due to different monitor calibration functions between imaging modalities (senders) and viewing stations (receivers), however, an undesirable visualization discrepancy may occur. These calibration functions may be described as being performed by a modality or viewing station, but in more particular examples, may be performed by video drivers of the respective apparatuses, software associated with monitors of the respective apparatuses or the like. In one example, an imaging modality may apply a first calibration function such as the gamma correction function (e.g., $\gamma=2.2$) to an acquired image viewed by a monitor of the modality. The viewing station in this example, however, may apply a second, different calibration function to the acquired image viewed by a monitor of the viewing station—the second calibration function in one example being the DICOM GSDF. For more information on the DICOM GSDF, see National Electrical Manufacturers Association (NEMA), PS 3.14-2009, entitled: *Digital Imaging and Communications in Medicine (DICOM)—Part 14: Grayscale Standard Display Function*, the content of which is hereby incorporated by reference in its entirety.

In the above example, an imaging modality may have a particular gamma value (the value that describes the relationship between the varying levels of luminance that a monitor can display). This gamma value may differ from one imaging modality to another imaging modality, which may compound the undesirability of differences in monitor calibration functions in various instances in which a viewing station may receive images from different modalities.

SUMMARY OF THE INVENTION

In light of the foregoing background, exemplary embodiments of the present invention provide an apparatus, method and computer-readable storage medium for compensating for image-quality discrepancies between an imaging modality and a viewing station. According to one aspect of exemplary embodiments of the present invention, an apparatus is provided that includes a processor and a memory storing executable instructions that in response to execution by the processor cause the apparatus to at least perform a number of operations. In this regard, the apparatus is caused to receive a digital image including a plurality of pixels each of which has a pixel value of a plurality of pixel values, where the pixel value of each pixel has been calibrated according to a first calibration function for calibrating an image for display by a first monitor, such as the gamma function.

The apparatus is caused to transform the pixel value of each of at least some of the pixels to a corresponding transformed pixel value calibrated according to a different, second calibration function for calibrating an image for display by a second monitor, such as the Digital Imaging and Communications in Medicine (DICOM) Grayscale Standard Display Function (GSDF). The apparatus is also caused to cause output of the digital image including the plurality of pixels each of at least some of which has a transformed pixel value, where the respective digital image is displayable by the second monitor. In one example, the apparatus is caused to transform the pixel value according to a lookup table that relates pixel values calibrated according to the first calibration function to corresponding pixel values calibrated according to the second calibration function.

The first and second calibration functions may be respective functions for calculating luminance as a function of pixel value. In one example, the first calibration function and second calibration function may be described by the following functions for calculating luminance ML and SL, respectively, as a function of pixel value x:

$$ML=G(x)$$

$$SL=F(x)$$

In this example, the apparatus may be caused to calculate a transformed pixel value LUT as a function of pixel value x in accordance with the following:

$$LUT=F^{-1}(G(x))$$

in which $F^{-1}$ denotes the inverse function of F.

In another example, the first calibration function may be described by the following function for calculating luminance $ML_i$ as a function of pixel value $x_i$:

$$ML_i=G(x_i)$$

In this example, the second calibration function is described by the following function for calculating luminance $SL_j$ as a function of pixel value $x_j$:

$$SL_j=F(x_j)$$

The apparatus, then, may be caused to transform the pixel value according to a lookup table that relates $(x_i, x_j)$ where $|ML_i-SL_j|$ has the minimum value.

The apparatus may be caused to receive a digital image from an imaging modality of a plurality of different types of modalities each of which has a respective first calibration function for calibrating an image for display by a first monitor. In such instances, the memory may further store executable instructions that in response to execution by the processor cause the apparatus to further determine a type of modality from which the digital image is received. The apparatus may then be caused to transform the pixel value based on the determined type of modality.

BRIEF DESCRIPTION OF THE DRAWINGS

Figure 1:
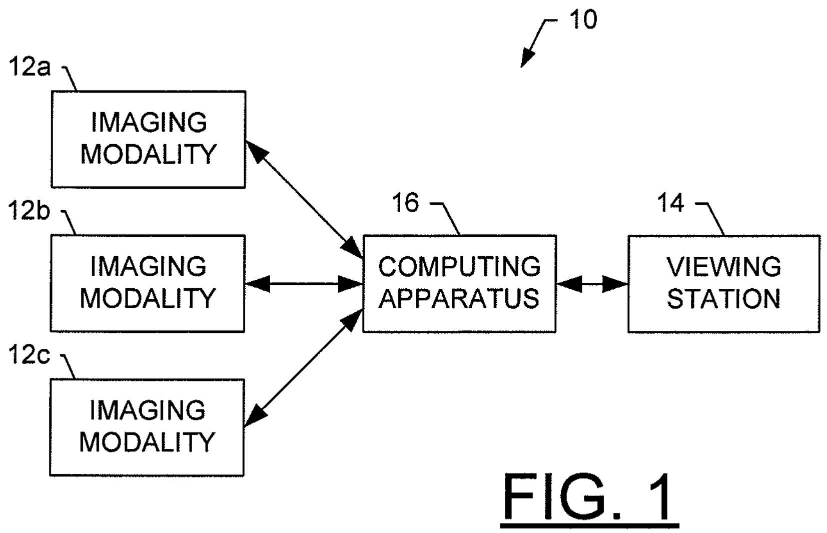
Figure 2:
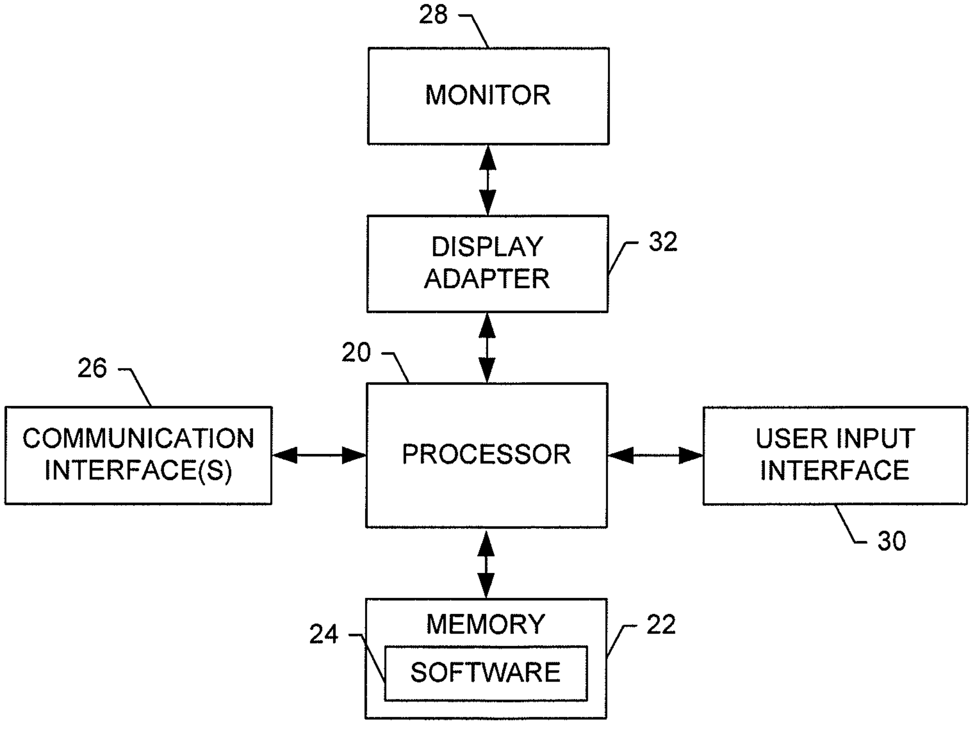
Figure 3:
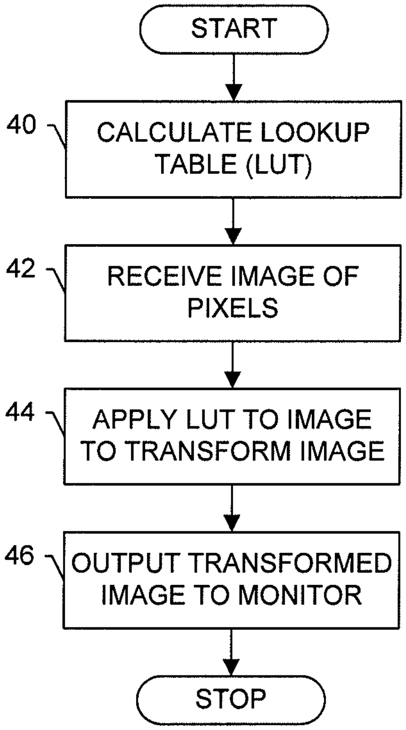
Figure 4:
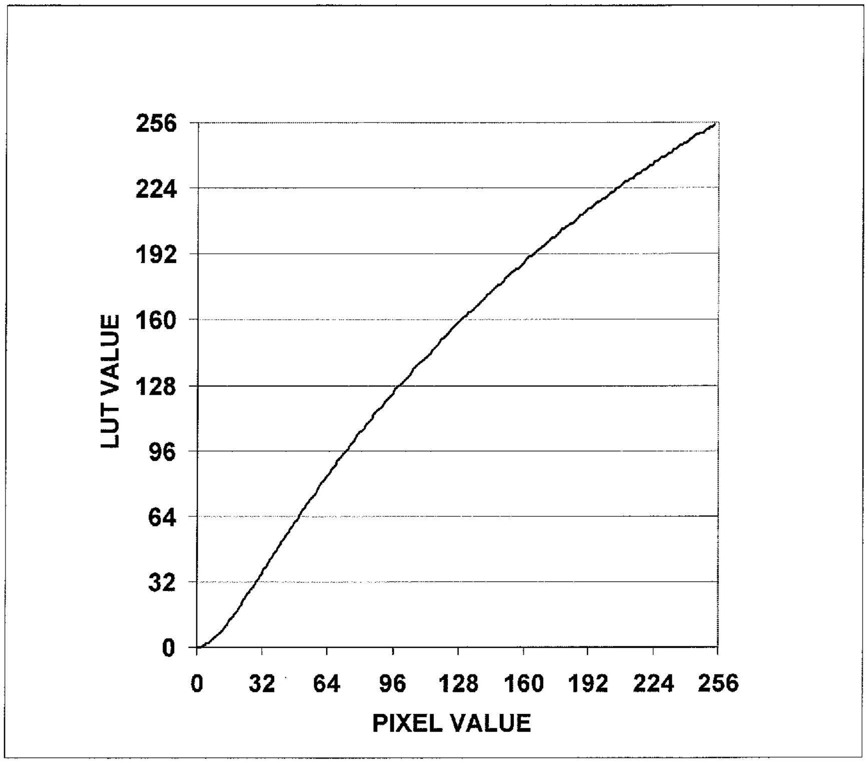
Figure 5:
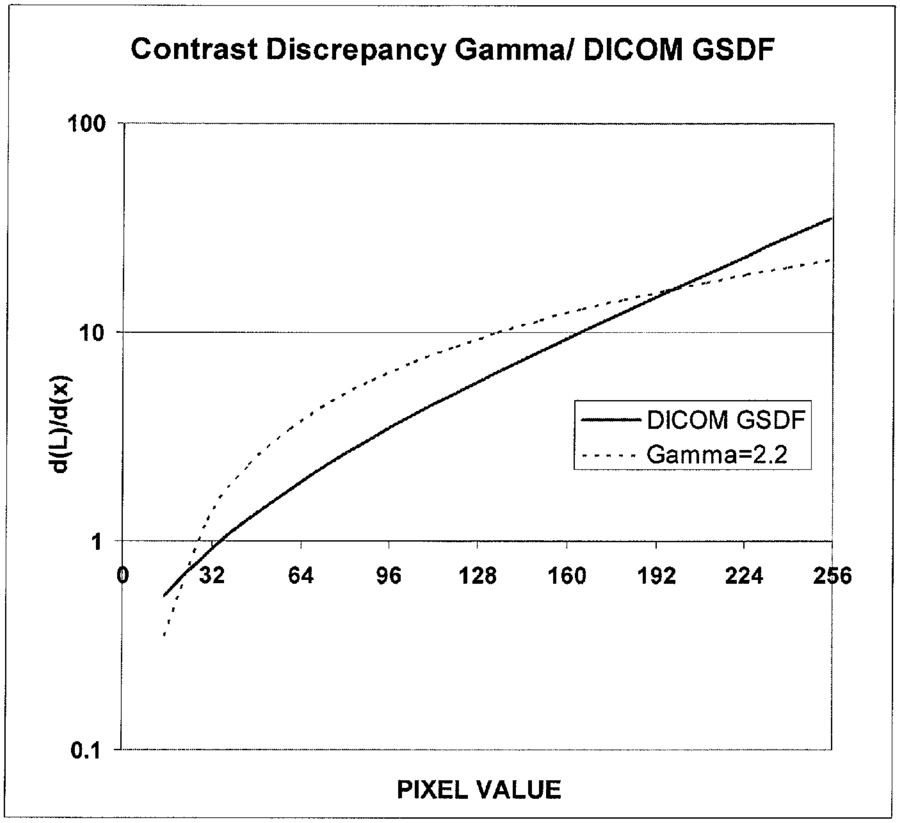
Figure 6:
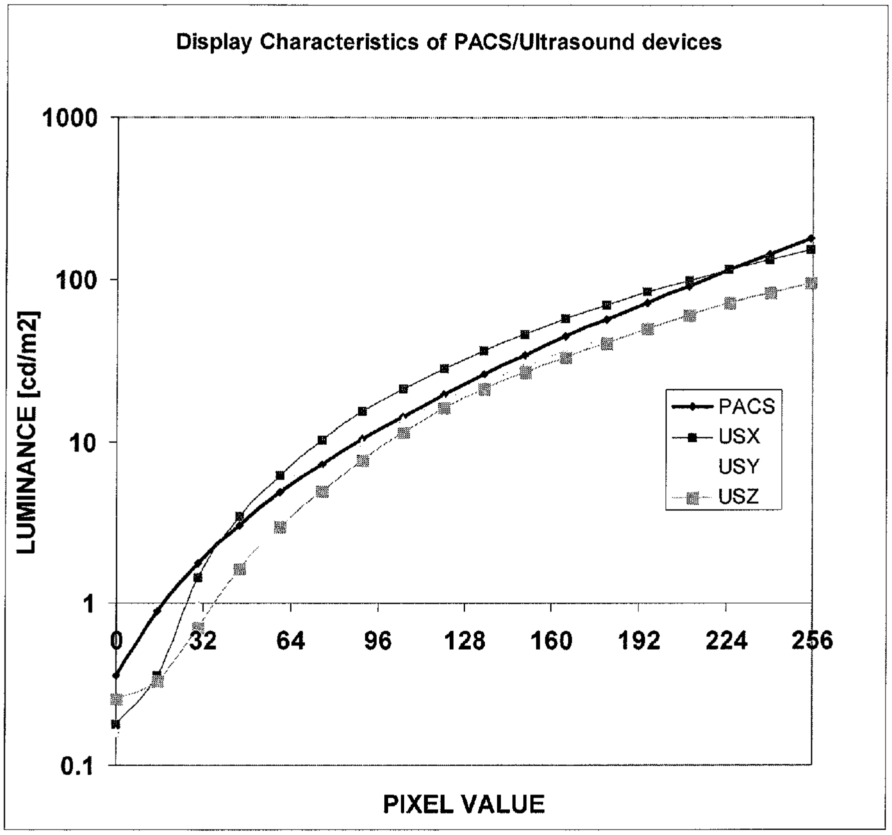

Having thus described the invention in general terms, reference will now be made to the accompanying drawings, which are not necessarily drawn to scale, and wherein:

FIG. 1 is a schematic block diagram of a system configured to operate in accordance with exemplary embodiments of the present invention;

FIG. 2 is a schematic block diagram of an apparatus that may be configured to operate as or otherwise perform one or more functions of one or more of the components of the system of FIG. 1, in accordance with embodiments of the present invention; and FIG. 3 is a flowchart illustrating various operations in a method according to exemplary embodiments of the present invention;

FIG. 4 is a graph that illustrates lookup table (LUT) values for an example image, according to one example embodiment of the present invention;

FIG. 5 is a graph that illustrates a change in image contrast due to different calibration functions, according to example embodiments of the present invention; and FIG. 6 is a graph that illustrates display characteristics of a PACS monitor and three ultrasound devices, according to one example embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Further, the apparatus and method of example embodiments of the present invention will be primarily described in conjunction with medical-imaging applications. It should be understood, however, that the apparatus and method can be utilized in conjunction with a variety of other applications, both in the medical industry and outside of the medical industry. Like numbers refer to like elements throughout.

FIG. 1 illustrates a system 10 that may benefit from exemplary embodiments of the present invention ("exemplary" as used herein referring to "serving as an example, instance or illustration"). As shown, the system includes one or more imaging modalities 12 (three example modalities being shown as modalities 12*a*, 12*b* and 12*c*) for acquiring an image, such as an image of the human body or parts of the human body for clinical purposes such as examination, diagnosis and/or treatment. Examples of suitable modalities include, for example, ultrasound (US), magnetic resonance (MR), positron emission tomography (PET), computed tomography (CT), mammograms (MG) digital radiology (DR), computed radiology (CR) or the like.

The system also includes a viewing station 14 configured to receive an image from one or more modalities 12, and present the image such as for review by a medical professional such as a radiologist. In one example embodiment, the viewing station may be a picture archiving and communication system (PACS) viewing station (or workstation).

As explained in the background section, in various instances, a modality 12 and viewing station 14 may apply different monitor calibration functions to images presented by monitors of the respective apparatuses. For example, a modality may apply the gamma correction function, while the viewing station may apply the DICOM GSDF. This difference in monitor calibration functions may lead to an undesirable visual discrepancy between an image presented by the modality, and the same image presented by the viewing station. As explained in greater detail below, the system of example embodiments of the present invention therefore further includes a computing apparatus 16 configured to transform pixel values calibrated according to a first calibration function (e.g., gamma correction) to corresponding pixel values calibrated according to a second, different calibration function (DICOM GSDF). In this manner, the computing apparatus may compensate for visual discrepancies otherwise due to the different calibration functions.

The imaging modality 12, viewing station 14 and/or computing apparatus 16 may be configured to directly and/or indirectly communicate with one another in any of a number of different manners including, for example, any of a number of wireline or wireless communication or networking techniques. Examples of such techniques include, without limitation, Universal Serial Bus (USB), radio frequency (RF), Bluetooth (BT), infrared (IrDA), any of a number of different cellular (wireless) communication techniques such as any of a number of 2G, 2.5G or 3G communication techniques, local area network (LAN), wireless LAN (WLAN) techniques or the like. In accordance with various ones of these techniques, the imaging modality, viewing station 14 and/or computing apparatus can be coupled to and configured to communicate across one or more networks. The network(s) can comprise any of a number of different combinations of one or more different types of networks, including data and/or voice networks. For example, the network(s) can include one or more data networks, such as a LAN, a metropolitan area network (MAN), and/or a wide area network (WAN) (e.g., Internet), and include one or more voice networks, such as a public-switched telephone network (PSTN). Although not shown, the network(s) may include one or more apparatuses such as one or more routers, switches or the like for relaying data, information or the like between the imaging modality, viewing station and/or computing apparatus.

Reference is now made to FIG. 2, which illustrates a block diagram of an apparatus 18 that may be configured to operate as or otherwise perform one or more functions of an imaging modality 12, viewing station 14 and/or computing apparatus 16. Although shown in FIG. 1 as separate apparatuses, in some embodiments, one or more of the respective apparatuses may support more than one of a modality, viewing station and/or computing apparatus, logically separated but co-located within the entit(ies). For example, a single apparatus may support a logically separate, but co-located modality and computing apparatus, or in another example, a single apparatus may support a logically separate, but co-located viewing station and computing apparatus.

Generally, the apparatus of exemplary embodiments of the present invention may comprise, include or be embodied in one or more fixed electronic devices, such as one or more of a laptop computer, desktop computer, workstation computer, server computer or the like. Additionally or alternatively, the apparatus may comprise, include or be embodied in one or more portable electronic devices, such as one or more of a mobile telephone, portable digital assistant (PDA), pager or the like. The apparatus of exemplary embodiments of the present invention includes various means for performing one or more functions in accordance with exemplary embodiments of the present invention, including those more particularly shown and described herein. It should be understood, however, that one or more of the entities may include alternative means for performing one or more like functions, without departing from the spirit and scope of the present invention.

As shown in FIG. 2, the apparatus may include a processor 20 connected to a memory 22. The memory can comprise volatile and/or non-volatile memory, and typically stores content, data or the like. In this regard, the memory may store one or more software applications 24, modules, instructions or the like for the processor to perform steps associated with operation of the apparatus in accordance with embodiments of the present invention. The memory may also store content transmitted from, and/or received by, the apparatus. As described herein, the software application(s) may each comprise software operated by the apparatus. It should be understood, however, that any one or more of the software applications described herein may alternatively be implemented by firmware, hardware or any combination of software, firmware and/or hardware, without departing from the spirit and scope of the present invention.

In addition to the memory 22, the processor 20 can also be connected to at least one interface or other means for displaying, transmitting and/or receiving data, content or the like, such as in accordance with USB, RF, BT, IrDA, WLAN, LAN, MAN, WAN (e.g., Internet), PSTN techniques or the like. In this regard, the interface(s) can include at least one communication interface 26 or other means for transmitting and/or receiving data, content or the like. In addition to the communication interface(s), the interface(s) can also include at least one user interface that can include one or more earphones and/or speakers, a monitor 28, and/or a user input interface 30. The user input interface, in turn, can comprise any of a number of devices allowing the apparatus to receive data from a user, such as a microphone, a keypad, a touch-sensitive surface (integral or separate from the monitor), a joystick, or other input device. As will be appreciated, the processor may be directly connected to other components of the apparatus, or may be connected via suitable hardware. In one example, the processor may be connected to the monitor via a display adapter 32 configured to permit the processor to send graphical information to the monitor.

As indicated above, the system of example embodiments of the present invention includes a computing apparatus 16 configured to transform pixel values calibrated according to a first calibration function (e.g., gamma correction) to corresponding pixel values calibrated according to a second, different calibration function (DICOM GSDF). In this manner, the computing apparatus may compensate for visual discrepancies otherwise due to the different calibration functions. The computing apparatus may be configured to apply the transformation in any of a number of different manners. As explained below, the computing apparatus may be configured to transform pixel values using a lookup table (LUT). It should be understood, however, that the computing apparatus may be equally configured to transform pixel values using an algorithm such as that from which an appropriate LUT may be calculated.

Reference is now made to FIG. 3, which illustrates various operations in a method according to example embodiments of the present invention. As shown in block 40, the method may include calculating or otherwise retrieving a LUT for transformation of pixel values calibrated according to a first calibration function (e.g., gamma correction) to corresponding pixel values calibrated according to a second, different calibration function (DICOM GSDF)—these corresponding pixel values at times being referred to as LUT values. More particularly, for example, consider pixel values calibrated according to a first calibration function. For each such pixel value, a corresponding LUT value calibrated according to a second calibration function may be determined by first determining the luminance for the pixel value calibrated according to the first calibration function, and then determining the pixel value calibrated according to the second calibration function that yields the determined luminance. The LUT may be calculated in a number of different manners, which may depend on whether the first and second calibration functions are known or unknown. Examples of calculating a LUT in each instance are presented below.

A. Known Calibration Functions

In an instance in which the first and second calibration functions are known, the LUT may be calculated based on the respective functions. In this instance, assume for example that the first calibration function (the function of the imaging modality 12) may be described by the following representation of modality luminance (ML), and that the second calibration function (the function of the viewing station 14) may be described by the following representation of the station luminance (SL):

$$ML=G(x) \tag{1}$$

$$SL=F(x) \tag{2}$$

In the preceding, x represents the pixel value that belongs to the domain $[-2^{n-1}, 2^{n-1}-1]$ for a signed image or $[0, 2^n-1]$ for an unsigned image (n representing the number of bits of the pixel value).

Given the above equations (1) and (2), the LUT of one example embodiment may be calculated in accordance with the following:

$$LUT=F^{-1}(G(x)) \tag{3}$$

where $F^{-1}$ denotes the inverse function of F. A solution for the above expression of the LUT exists in instances in which both functions F(x) and G(x) are monotone. This is the case, for example, for both gamma and DICOM GSDF functions. In addition, the SL range may be equal or larger than the ML range to thereby produce a unique solution, which may be the case with typical PACS monitors.

In a more particular example in which the first and second calibration functions are known, consider an instance in which the first calibration function is a gamma correction, and the second calibration function is the DICOM GSDF. In this example, the gamma function may be described as follows:

$$ML=G(x)=C\times x^{\gamma}+B \tag{4}$$

In equation (4), C and B represent the contrast and minimum luminance (brightness) of the monitor of the modality 12, which may be set by respective monitor controls. The variable x represents a normalized pixel value between 0 and 1, which may take into account minimum and the maximum pixel values, and γ (gamma) represents the gamma value of the modality monitor. For a signed DICOM MONOCHROME2 image with pixel of range $[-2^{n-1}, 2^{n-1}-1]$, the corresponding ML range may be $(ML_{min}, ML_{max})$, where $ML_{min}=C\times(-2^{n-1})^{\gamma}+B$ and $ML_{max}=C\times(2^{n-1}-1)^{\gamma}+B$.

Also in this more particular example in which the second calibration function is the DICOM GSDF, the luminance of the monitor of the viewing station 14 may be derived from the following DICOM GSDF (a monotone function):

$$\log_{10}L(j)=\frac{a+c\cdot\mathrm{Ln}(j)+e\cdot(\mathrm{Ln}(j))^2+g\cdot(\mathrm{Ln}(j))^3+m\cdot(\mathrm{Ln}(j))^4}{1+b\cdot\mathrm{Ln}(j)+d\cdot(\mathrm{Ln}(j))^2+f\cdot(\mathrm{Ln}(j))^3+h\cdot(\mathrm{Ln}(j))^4+k\cdot(\mathrm{Ln}(j))^5} \tag{5}$$

In the preceding, Ln refers to the natural logarithm, and j refers to an index (1 to 1023) of luminance levels $L_j$ of the just-noticeable differences (JND), where the JND may be considered the luminance difference of a given target under given viewing conditions that the average human observer can just perceive. In this regard, one step in the JND index j may result in a luminance difference that is a JND. Also in the preceding, the constants a-h, k and m may be set as follows: $a=-1.3011877$, $b=-2.5840191\times10^{-2}$, $c=8.0242636\times10^{-2}$, $d=-1.0320229\times10^{-1}$, $e=1.3646699\times10^{-1}$, $f=2.8745620\times10^{-2}$, $g=-2.5468404\times10^{-2}$, $h=-3.1978977\times10^{-3}$, $k=1.2992634\times10^{-4}$ and $m=1.3635334\times10^{-3}$.

The inverse function of equation (5) is as follows:

$$j(L)=A+B\cdot\mathrm{Log}_{10}(L)+C\cdot(\mathrm{Log}_{10}(L))^2+D\cdot(\mathrm{Log}_{10}(L))^3+E\cdot(\mathrm{Log}_{10}(L))^4+F\cdot(\mathrm{Log}_{10}(L))^5+G\cdot(\mathrm{Log}_{10}(L))^6+H\cdot(\mathrm{Log}_{10}(L))^7+I\cdot(\mathrm{Log}_{10}(L))^8 \quad (6)$$

In equation (6), $\mathrm{Log}_{10}$ represents a logarithm to the base 10, and the constants A-I may be set as follows: A=71.498068, B=94.593053, C=41.912053, D=9.8247004, E=0.28175407, F=−1.1878455, G=−0.18014349, H=0.14710899 and I=−0.017046845.

Equation (6) permits computing discrete JNDs for the modality luminance range ($ML_{min}$, $ML_{max}$) as $j_{min}=j(ML_{min})$ and $j_{max}=j(ML_{max})$. In this regard, for a signed image, the span of j values may range from $j_{min}$ for pixel value $x=-2^{n-1}$, $j_{max}$ for pixel value $x=2^{n-1}-1$, such as according to the following:

$$j(x) = j_{min} + \frac{x+2^{n-1}}{2^n-1}(j_{max}-j_{min}) \quad (7)$$

For an unsigned image, the span of j values may range from $j_{min}$ for pixel value x=0, to $j_{max}$ for pixel value $x=2^{-1}-1$, such as according to the following:

$$j(x) = j_{min} + \frac{x}{2^n-1}(j_{max}-j_{min}) \quad (8)$$

The corresponding luminance values of each j(x), then, can be calculated by equation (5) as L(j(x)).

In order to calculate the LUT, for each pixel value x calibrated according to the first calibration function, the corresponding LUT value may be found. This may be achieved by being given or otherwise determining the minimum and maximum luminance values ($ML_{min}$ and $ML_{max}$) and the gamma value (γ) of the monitor of the modality 12, which can be used to determine the parameters C and B of equation (4). Alternatively, in an instance in which the luminance range of the viewing station 14 monitor ($SL_{min}$ and $SL_{max}$) is known, and the gamma of the modality monitor is known, these values may be substituted in equation (4) to determine the parameters C and B. In another alternative, in an instance in which the parameters C and B and the gamma value of the modality monitor are given, these parameters may be used to determine the minimum and maximum luminance values ($ML_{min}$ and $ML_{max}$). In any instance, by substitution of $ML_{min}$ and $ML_{max}$ (or $SL_{min}$ and $SL_{max}$) in equation (6), one may determine the values of $j_{min}$ and $j_{max}$.

For each pixel value x, equation (4) may be used to determine G(x), which may be substituted into equation (6) to determine j(G(x)). The value j(G(x)) may be substituted into equation (7) or equation (8) (depending on the signed/unsigned nature of the image) to determine the value x as the corresponding LUT value. Written notationally, for a signed image, the LUT value may be determined from value j(G(x)) in accordance with the following:

$$LUT = \frac{j(G(x))-j_{min}}{j_{max}-j_{min}}(2^n-1)-2^{n-1} \quad (9)$$

Or for an unsigned image, the LUT value may be determined from value j(G(x)) in accordance with the following:

$$LUT = \frac{j(G(x))-j_{min}}{j_{max}-j_{min}}(2^n-1) \quad (10)$$

As an example, consider the computing apparatus 16 being configured to transform pixel values calibrated according to gamma correction to corresponding pixel values calibrated according to DICOM GSDF. Further consider that the modality monitor (gamma calibrated) has the following parameter values: $ML_{min}=B=0.4$ cd/m$^2$, $ML_{max}=178$ cd/m$^2$, and γ=2.2. In this example, the LUT values for an 8-bit (n=8) unsigned image may be represented as in the graph of FIG. 4.

B. Unknown Calibration Functions

In an instance in which either or both of the first or second calibration functions are unknown, the LUT may be calculated by looking to the display characteristic curves of the modality 12 and viewing station 14, each of which may be determined or otherwise measured by means of a quantitative procedure. The display characteristic curve for a monitor may define the relationship between luminance and pixel values (equation (1) and (2) above). One may, for example, use TG18-LN test patterns for this purpose. These test patterns are provided by the American Association of Physicists in Medicine (AAPM), task group (TG) 18, and may be imported to the modality and sent to the viewing station to mimic an image workflow. By using test patterns such as the TG18-LN test patterns, a number of distinct luminance levels may be measured and the remaining luminance values may be interpolated, such as according to a cubic spline. The interpolated display characteristic curves of the modality and viewing station may then be used to determine the LUT, such as by taking equation (3) into consideration.

More particularly, for example, assume that the modality and viewing station transfer functions are measured and described by the following tabulated functions:

$$ML_i=G(x_i) \quad (11)$$

$$SL_j=F(x_j) \quad (12)$$

In equations (11) and (12), $x_i$ represents a pixel value calibrated according to the first calibration function, and $x_j$ represents a pixel value calibrated according to the second calibration function, each of which may be in the range $[-2^{n-1}, 2^{n-1}-1]$ for a signed image or $[0, 2^n-1]$ for an unsigned image. $ML_i$ represents the modality luminance for its pixel value $x_i$, and $SL_j$ represents the viewing station luminance for its pixel value $x_j$. The LUT may then be calculated according to the following pseudo-algorithm for a signed image:

```
For each integer i from range [−2^(n−1), 2^(n−1) −1] do
    For each integer j from range [−2^(n−1), 2^(n−1) −1] do
        Find a single SL_j where | ML_i − SL_j | has the minimum value
            Save (x_i, x_j)
```

A similar pseudo-algorithm may be implemented for an unsigned image by appropriately adjusting the range of i and j values. After execution of above algorithm, the LUT may be uniquely defined by the set of ($x_i$, $x_j$) values.

Returning to FIG. 3, after calculating or otherwise retrieving the LUT, the method may include receiving an image including a plurality of pixels each of which has a pixel value calibrated according to the first calibration function, as shown in block 42. The image may be formatted in any of a number of different manners, such as in accordance with the DICOM standard. The method may include applying the LUT to determine for each pixel value of each pixel of the image, a corresponding pixel value (LUT value) calibrated according to the second calibration function, as shown in block 44. The thus transformed pixel values may then be further processed, as appropriate, and output to the monitor of the viewing station 14 for display, as shown in block 46.

The LUT may be applied in any of a number of different manners, and at a number of different locations in an image workflow from a modality 12 to viewing station 14. In one example in which the second calibration function is the DICOM GSDF, the LUT may be applied as a presentation LUT or value-of-interest LUT in accordance with appropriate DICOM standards. Also, the LUT may be applied by the computing apparatus 16 which may be implemented as part of the imaging modality 12 or viewing station 14, or as a separate device between the modality and viewing station. The computing apparatus (separate or part of the modality) may be configured to add the LUT as a presentation LUT. The LUT values may be burned or otherwise stored with the respective pixels of the image, or the LUT may be passed through with the image. In another example in which the computing apparatus is implemented at the viewing station, image viewer software on the viewing station may be configurable to apply the LUT as a presentation LUT.

In various instances, particularly when the computing apparatus 16 is implemented separate from the imaging modality 12, the computing apparatus may be configured to apply different LUTs for different types of modalities (e.g., modalities 12*a*, 12*b*, 12*c*). In such instances, the computing apparatus may be configured to determine the type of modality that captured an image, and load and apply an appropriate LUT for the respective type of modality. The computing apparatus may be configured to determine the type of modality in a number of different manners.

In one example in which the imaging modalities 12 and computing apparatus 16 are coupled to and configured to communicate with one another across a network, each imaging modality may have a respective network address (e.g., IP address). In this example, the computing apparatus may store or otherwise have access to a table that associates the network addresses of the modalities with their modality types. When the computing apparatus receives an image across the network, the image or a record referring to the image may identify the network address of its source modality. The computing apparatus may then consult the table based upon the source network address to identify the type of the respective modality.

In another example, the image may be formatted to include a header with one or more tags including respective acquisition parameters that refer to the name of the modality 12 that acquired the image (source modality), its software version or the like. In this other example, the computing apparatus 16 may store or otherwise have access to a table that associates acquisition parameters (tags) with modality types, or may be setup to operate according to logic that specifies application of the LUT in instances in which an image has parameters (tags) with particular values. When the computing apparatus receives an image, the computing apparatus may be configured to analyze the image's header and its parameters (tags), and apply the LUT in accordance with the table or logic.

In a more particular example, a DICOM image may include a tag (0008, 0070) that identifies the "Manufacturer ID," tag (0008, 1090) that identifies the "Manufacturer's Model Name ID," tag (0008, 0060) that identifies the "Modality ID" and tag (0008, 1010) that includes a name identifying the machine that produce images. In this example, the computing apparatus 16 may be configured to apply the LUT in instances in which the computing apparatus receives an image from US (ultrasound) modality X with the name "koko" and software version "12.1.1." When the computing apparatus receives a DICOM image for display, the computing apparatus may be configured to analyze the image's header and its parameters. In an instance in which the "Modality ID" is US and "Manufacturer's Model Name ID" is "koko," the computing apparatus may apply the LUT; otherwise, the computing apparatus may forego application of the LUT.

To further illustrate example embodiments of the present invention, consider a hypothetical image workflow investigation in which the same image was displayed on an image-modality monitor with gamma calibration, and on a PACS viewing station with DICOM GSDF calibration. This investigation indicated that there would be no visual consistency in image display on monitors that were calibrated to gamma and DICOM GSDF calibration functions. As an example, FIG. 5 illustrates the derivatives of equations (4) and (5) for a luminance range of [0.36, 177] for a pixel range [0, 255]. Note that the vertical axis is the degree of luminance change (image contrast d(L)/d(x)), and it is in a logarithmic scale. The derivative of equation (5) (DICOM GSDF) is close to a linear line indicating perceptual linearity (the thick line in the figure), while the derivative of equation (4) (gamma calibration) is not a line but a logarithmic function in a logarithmic scale.

Even further, consider tests of a real-world workflow in which three ultrasound devices using gamma calibration, noted as USX, USY and USZ, sent images to a PACS viewing station connected to a monitor calibrated to DICOM GSDF. In these tests, patterns similar to TG18-LN were used, and the measured display characteristic curves of ultrasound devices and PACS monitor were determined (including cubic spline interpolation). The gamma values (γ) of the ultrasound device monitors were estimated by minimizing the mean square errors (MSE) of equation (4) and measured display characteristic values. The PACS monitor was a color LG 1200ME monitor with a resolution 280×1024, and with a color temperature set to 6500 K. Its display characteristics curve was evaluated with the ideal DICOM GSDF function.

The above real-world workflow investigation provided the following results for the measured minimum and maximum luminance values, gamma values (γ) and MSEs:

| Device | Minimum L | Maximum L | Estimated γ | MSE |
|---|---|---|---|---|
| PACS | 0.36 | 177.52 | NA | 0.268 |
| USX | 0.18 | 153.08 | 2.27 | 0.261 |
| USY | 0.16 | 94.71 | 2.23 | 0.036 |
| USZ | 0.26 | 95.00 | 2.42 | 0.189 |

The deviation of the PACS monitor from the DICOM GSDF ideal curve was on average 5.5% with a minimum and maximum deviation of 0.5% and 12.3%, respectively. These measurements showed that the monitors were indeed calibrated according to the functions (gamma and DICOM GSDF), with the acceptable tolerance deviation from theoretical models.

The display characteristics of all four monitors in this example are shown in FIG. 6. As FIG. 6 illustrates, for smaller pixel values (<32), the PACS monitor produces more light. Usually pixel values of a smaller range are noise contribution to ultrasound images, and physicians often like noise to be displayed closer to pure black (minimum luminance). In addition, the derivatives of the display characteristics of the ultrasound devices and PCS monitor show a very similar discrepancy in image contrast as illustrated by the theoretical discrepancy shown in FIG. 5.

According to one aspect of the present invention, all or a portion of the modality 12, viewing station 14 and/or computing apparatus 16 of exemplary embodiments of the present invention, generally operate under control of a computer program. The computer program for performing the methods of exemplary embodiments of the present invention may include one or more computer-readable program code portions, such as a series of computer instructions, embodied or otherwise stored in a computer-readable storage medium, such as the non-volatile storage medium.

FIG. 3 is a flowchart reflecting methods, systems and computer programs according to exemplary embodiments of the present invention. It will be understood that each block or step of the flowchart, and combinations of blocks in the flowchart, may be implemented by various means, such as hardware, firmware, and/or software including one or more computer program instructions. As will be appreciated, any such computer program instructions may be loaded onto a computer or other programmable apparatus to produce a machine, such that the instructions which execute on the computer or other programmable apparatus (e.g., hardware) create means for implementing the functions specified in the block(s) or step(s) of the flowchart. These computer program instructions may also be stored in a computer-readable memory that may direct a computer or other programmable apparatus to function in a particular manner, such that the instructions stored in the computer-readable memory produce an article of manufacture including instruction means which implement the function specified in the block(s) or step(s) of the flowchart. The computer program instructions may also be loaded onto a computer or other programmable apparatus to cause a series of operational steps to be performed on the computer or other programmable apparatus to produce a computer-implemented process such that the instructions which execute on the computer or other programmable apparatus provide steps for implementing the functions specified in the block(s) or step(s) of the flowchart.

Accordingly, blocks or steps of the flowchart support combinations of means for performing the specified functions, combinations of steps for performing the specified functions and program instruction means for performing the specified functions. It will also be understood that one or more blocks or steps of the flowchart, and combinations of blocks or steps in the flowchart, may be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. It should therefore be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An apparatus comprising a processor and a memory storing executable instructions that in response to execution by the processor cause the apparatus to at least:

receive a digital image captured by an imaging modality and including a plurality of pixels each of which has a pixel value of a plurality of pixel values, the pixel value of each pixel having previously been calibrated according to a first calibration function associated with the imaging modality for calibrating for display by a first monitor;

transform the pixel value of each of at least some of the pixels that have previously been calibrated according to the first calibration function associated with the imaging modality to a corresponding transformed pixel value calibrated according to a different, second calibration function for calibrating an image for display by a second monitor, different than the first monitor; and cause output of the digital image including the plurality of pixels each of at least some of which has a transformed pixel value, the respective digital image being displayable by the second monitor.

2. The apparatus of claim 1, wherein the apparatus being caused to transform the pixel value further includes transforming the pixel value according to a lookup table that relates pixel values calibrated according to the first calibration function to corresponding pixel values calibrated according to the second calibration function.

3. The apparatus of claim 1, wherein the first calibration function is a first function for calculating luminance as a function of pixel value, and the second calibration function is a different, second function for calculating luminance as a function of pixel value.

4. The apparatus of claim 3, wherein the first calibration function is described by the following function for calculating luminance ML as a function of pixel value x:

$$ML=G(x)$$

wherein the second calibration function is described by the following function for calculating luminance SL as a function of pixel value x:

$$SL=F(x)$$

wherein the apparatus being caused to transform the pixel value further includes calculating a transformed pixel value LUT as a function of pixel value x in accordance with the following:

$$LUT=F^{-1}(G(x))$$

in which $F^{-1}$ denotes the inverse function of F.

5. The apparatus of claim 3, wherein the first calibration function is described by the following function for calculating luminance $ML_i$ as a function of pixel value $x_i$:

$$ML_i=G(x_i)$$

wherein the second calibration function is described by the following function for calculating luminance $SL_j$ as a function of pixel value $x_j$:

$$SL_j=F(x_j)$$

wherein the apparatus being caused to transform the pixel value further includes transforming the pixel value according to a lookup table that relates $(x_i, x_j)$ where $|ML_i-SL_j|$ has the minimum value.

6. The apparatus of claim 1, wherein the imaging modality is one of a plurality of different types of modalities each of which has a respective first calibration function for calibrating an image for display by a first monitor, wherein the memory further stores executable instructions that in response to execution by the processor cause the apparatus to further determine a type of modality from which the digital image is received, and wherein the apparatus being caused to transform the pixel value further includes transforming the pixel value based on the determined type of modality.

7. The apparatus of claim 1, wherein the first calibration function is the gamma correction function, and the second calibration function is the Digital Imaging and Communications in Medicine (DICOM) Grayscale Standard Display Function (GSDF).

8. A method comprising:

receiving a digital image captured by an imaging modality and including a plurality of pixels each of which has a pixel value of a plurality of pixel values, the pixel value of each pixel having previously been calibrated according to a first calibration function associated with the imaging modality for calibrating an image for display by a first monitor;

transforming the pixel value of each of at least some of the pixels that have previously been calibrated according to first calibration function associated with the imaging modality to corresponding transformed pixel value calibrated according to a different, second calibration function for calibrating an image for display by a second monitor, different than the first monitor; and causing output of the digital image including the plurality of pixels each of at least some of which has a transformed pixel value, the respective digital image being displayable by the second monitor, wherein transforming the pixel value is performed by a processor configured to transform the pixel value.

9. The method of claim 8, wherein transforming the pixel value includes transforming the pixel value according to a lookup table that relates pixel values calibrated according to the first calibration function to corresponding pixel values calibrated according to the second calibration function.

10. The method of claim 8, wherein the first calibration function is a first function for calculating luminance as a function of pixel value, and the second calibration function is a different, second function for calculating luminance as a function of pixel value.

11. The method of claim 10, wherein the first calibration function is described by the following function for calculating luminance ML as a function of pixel value x:

$$ML=G(x)$$

wherein the second calibration function is described by the following function for calculating luminance SL as a function of pixel value x:

$$SL=F(x)$$

wherein transforming the pixel value includes calculating a transformed pixel value LUT as a function of pixel value x in accordance with the following:

$$LUT=F^{-1}(G(x))$$

in which $F^{-1}$ denotes the inverse function of F.

12. The method of claim 10, wherein the first calibration function is described by the following function for calculating luminance $ML_i$ as a function of pixel value $x_i$:

$$ML_i=G(x_i)$$

wherein the second calibration function is described by the following function for calculating luminance $SL_j$ as a function of pixel value $x_j$:

$$SL_j=F(x_j)$$

wherein transforming the pixel value includes transforming the pixel value according to a lookup table that relates $(x_i, x_j)$ where $|ML_i-SL_j|$ has the minimum value.

13. The method of claim 8, wherein the imaging modality is one of a plurality of different types of modalities each of which has a respective first calibration function for calibrating an image for display by a first monitor, wherein the method further comprises determining a type of modality from which the digital image is received, and wherein transforming the pixel value includes transforming the pixel value based on the determined type of modality.

14. The method of claim 8, wherein the first calibration function is the gamma correction function, and the second calibration function is the Digital Imaging and Communications in Medicine (DICOM) Grayscale Standard Display Function (GSDF).

15. A non-volatile computer-readable storage medium having computer-readable program code portions stored therein that, in response to execution by a processor, cause an apparatus to at least:

receive a digital image captured by an imaging modality and including a plurality of pixels each of which has a pixel value of a plurality of pixel values, the pixel value of each pixel having previously been calibrated according to a first calibration function associated with the imaging modality for calibrating an image for display by a first monitor;

transform the pixel value of each of at least some of the pixels that have previously been calibrated according to the first calibration function associated with the imaging modality to a corresponding transformed pixel value calibrated according to a different, second calibration function for calibrating an image for display by a second monitor, different than the first monitor; and cause output of the digital image including the plurality of pixels each of at least some of which has a transformed pixel value, the respective digital image being displayable by the second monitor.

16. The computer-readable storage medium of claim 15, wherein the apparatus being caused to transform the pixel value further includes transforming the pixel value according to a lookup table that relates pixel values calibrated according to the first calibration function to corresponding pixel values calibrated according to the second calibration function.

17. The computer-readable storage medium of claim 15, wherein the first calibration function is a first function for calculating luminance as a function of pixel value, and the second calibration function is a different, second function for calculating luminance as a function of pixel value.

18. The computer-readable storage medium of claim 17, wherein the first calibration function is described by the following function for calculating luminance ML as a function of pixel value x:

$$ML=G(x)$$

wherein the second calibration function is described by the following function for calculating luminance SL as a function of pixel value x:

$$SL=F(x)$$

wherein the apparatus being caused to transform the pixel value further includes calculating a transformed pixel value LUT as a function of pixel value x in accordance with the following:

$$LUT=F^{-1}(G(x))$$

in which $F^{-1}$ denotes the inverse function of F.

19. The computer-readable storage medium of claim 17, wherein the first calibration function is described by the following function for calculating luminance $ML_i$ as a function of pixel value $x_i$:

$$ML_i=G(x_i)$$

wherein the second calibration function is described by the following function for calculating luminance $SL_j$ as a function of pixel value $x_j$:

$$SL_j=F(x_j)$$

wherein the apparatus being caused to transform the pixel value further includes transforming the pixel value according to a lookup table that relates $(x_i, x_j)$ where $|ML_i-SL_j|$ has the minimum value.

20. The computer-readable storage medium of claim 15, wherein the imaging modality is one of a plurality of different types of modalities each of which has a respective first calibration function for calibrating an image for display by a first monitor, wherein the computer-readable storage medium has further computer-readable program code portions stored therein that, in response to execution by the processor, cause the apparatus to further determine a type of modality from which the digital image is received, and wherein the apparatus being caused to transform the pixel value further includes transforming the pixel value based on the determined type of modality.

21. The computer-readable storage medium of claim 15, wherein the first calibration function is the gamma correction function, and the second calibration function is the Digital Imaging and Communications in Medicine (DICOM) Grayscale Standard Display Function (GSDF).

* * * * *

UNITED STATES PATENT AND TRADEMARK OFFICE

CERTIFICATE OF CORRECTION

PATENT NO. : 8,896,619 B2
APPLICATION NO. : 13/044122
DATED : November 25, 2014
INVENTOR(S) : Rezaee It is certified that error appears in the above-identified patent and that said Letters Patent is hereby corrected as shown below:

In the claims:

<u>Column 12,</u>
Line 10, “for calibrating for display” should read --for calibrating an image for display--.

<u>Column 13,</u>
Lines 23 and 24, “according to first” should read --according to the first--;
Lines 24 and 25, “imaging modality to corresponding” should read --imaging modality to a corresponding--.

Signed and Sealed this
Fourteenth Day of July, 2015

Michelle K. Lee
*Director of the United States Patent and Trademark Office*